US010232415B2

(12) United States Patent
Song et al.

(10) Patent No.: US 10,232,415 B2
(45) Date of Patent: Mar. 19, 2019

(54) APPARATUS FOR TREATING SUBSTRATE

(71) Applicant: Semes Co., Ltd., Cheonan-si, Chungcheongnam-do (KR)

(72) Inventors: Gil Hun Song, Cheonan-si (KR); Ki Ryong Choi, Hwaseong-si (KR); Young Chol Choi, Hwaseong-si (KR); Giu Su Park, Cheonan-si (KR); Sun Yong Park, Cheonan-si (KR)

(73) Assignees: Semes Co., Ltd., Chungcheongnam-do (KR); Samsung Electronics Co., Ltd., Gyeonggi-do (KR)

( * ) Notice: Subject to any disclaimer, the term of this patent is extended or adjusted under 35 U.S.C. 154(b) by 103 days.

(21) Appl. No.: 14/725,515

(22) Filed: May 29, 2015

(65) Prior Publication Data

US 2015/0343496 A1 Dec. 3, 2015

(30) Foreign Application Priority Data

May 29, 2014 (KR) ........................ 10-2014-0065389

(51) Int. Cl.
*H01L 21/67* (2006.01)
*B08B 13/00* (2006.01)

(52) U.S. Cl.
CPC .................................... *B08B 13/00* (2013.01)

(58) Field of Classification Search
CPC ............... G03F 7/162; H01L 21/02041; H01L 21/02043; H01L 21/02052; H01L 21/02054; H01L 21/02057–21/02074; H01L 21/02079; H01L 21/02082; H01L 21/02087; H01L 21/0209; H01L 21/67017; H01L 21/67023; H01L 21/67028; H01L 21/67034; H01L 21/6704; H01L 21/67051
See application file for complete search history.

(56) References Cited

U.S. PATENT DOCUMENTS

| | | | |
|---|---|---|---|
| 8,793,898 B2 | 8/2014 | Jeong et al. | |
| 2010/0146813 A1 | 6/2010 | Jeong et al. | |
| 2013/0167947 A1 * | 7/2013 | Nakano ............... | H01L 21/0206 137/343 |

FOREIGN PATENT DOCUMENTS

| | | |
|---|---|---|
| CN | 102078850 A | 6/2011 |
| JP | S 63229168 A | 9/1988 |
| JP | 10-57876 A | 3/1998 |
| JP | 2004-296811 A | 10/2004 |
| JP | 2005-340556 A | 12/2005 |
| KR | 2012-0056620 A | 6/2012 |

(Continued)

OTHER PUBLICATIONS

Machine Translation of Ito et al., JP 10-57876A, Mar. 1998.*

(Continued)

*Primary Examiner* — David G Cormier
(74) *Attorney, Agent, or Firm* — Harness, Dickey & Pierce, P.L.C.

(57) ABSTRACT

A substrate-treating apparatus is disclosed. The substrate-treating apparatus may include a vessel configured to provide a treatment space therein, a substrate-supporting unit provided in the vessel to support a substrate, and a spraying member configured to spray treatment solution on the substrate loaded on the substrate-supporting unit. The vessel may have an inner side surface, on which at least one texture pattern is formed.

11 Claims, 13 Drawing Sheets

(56) References Cited

FOREIGN PATENT DOCUMENTS

| | | | |
|---|---|---|---|
| KR | 20120074122 | A | 7/2012 |
| KR | 10-1276091 | B1 | 6/2013 |

OTHER PUBLICATIONS

James C. Bird et al., "Reducing the contact time of a bouncing drop", Macmillan Publishers Limited, Nov. 21, 2013, vol. 503, 14 pages.

* cited by examiner

APPARATUS FOR TREATING SUBSTRATE

CROSS-REFERENCE TO RELATED APPLICATIONS

This U.S. non-provisional patent application claims priority under 35 U.S.C. § 119 to Korean Patent Application No. 10-2014-0065389, filed on May 29, 2014, in the Korean Intellectual Property Office, the entire contents of which are hereby incorporated by reference.

BACKGROUND OF THE INVENTION

Example embodiments of the inventive concept related to an apparatus for treating a substrate, and in particular, to a substrate-treating apparatus for cleaning a substrate.

Contaminant materials (e.g., particles, organic contaminants, and metallic contaminants) remaining on a surface of a substrate lead to deterioration in electric characteristics of a semiconductor device and a production yield thereof. Accordingly, during a semiconductor fabrication process, a cleaning process may be performed before and/or after each unit step of the semiconductor fabrication process, to remove the contaminant materials from a surface of a substrate. In general, the process of cleaning a substrate may include a chemical treatment process, in which metallic materials, organic materials, or particles remaining on the substrate are removed from the substrate using chemical, a rinse process, in which chemical remaining on the substrate is removed using de-ionized water, and a dry process, in which organic solvent, nitrogen gas, or the like is used to dry the substrate.

A conventional apparatus for a cleaning process is disclosed in Korean Patent Publication No. 2012-0056620. The apparatus includes a vessel for collecting a variety of treatment solution and a substrate supporting member provided in the vessel. The vessel of the apparatus is provided to have a smooth inner side surface. However, the use of such a vessel may lead to re-contamination of a substrate. For example, chemical solution supplied for cleaning a substrate collides with the inner side surface of the vessel by a centrifugal force and then is rebounded to contaminate the substrate. Further, a fraction of the chemical solution collided with the vessel may form large drops moving toward the substrate and then colliding with other chemical solution moving toward the vessel. A fraction of the collided chemical solution may fall on the substrate, and this leads to contamination of the substrate.

SUMMARY

Example embodiments of the inventive concept provide a substrate-treating apparatus configured to restrain chemical solution from being rebounded toward a substrate, when the chemical solution collides with a vessel during a substrate cleaning process.

Other example embodiments of the inventive concept provided a substrate-treating apparatus configured to reduce a size of each drop of the chemical solution, which may be rebounded toward the substrate by collision with a vessel, during a substrate cleaning process.

According to example embodiments of the inventive concept, a substrate-treating apparatus may include a vessel configured to provide a treatment space therein, a substrate-supporting unit provided in the vessel to support a substrate, and a spraying member configured to spray treatment solution on the substrate loaded on the substrate-supporting unit. The vessel may have an inner side surface, on which at least one texture pattern is formed.

In example embodiments, the at least one texture pattern may be provided to have a linear shape.

In example embodiments, the at least one texture pattern may include a vertical texture pattern provided perpendicular to a horizontal surface and parallel to a vertical direction.

In example embodiments, the at least one texture pattern may include an inclined texture pattern provided to be inclined with respect to a horizontal surface.

In example embodiments, the at least one texture pattern may include a spiral texture pattern provided in a spiral fashion.

In example embodiments, the at least one texture pattern may include a vertical texture pattern provided perpendicular to a horizontal surface and parallel to a vertical direction, and a horizontal texture pattern provided parallel to the horizontal surface. The horizontal texture pattern may be provided to intersect the vertical texture pattern.

In example embodiments, the at least one texture pattern may include sandpaper-like texture patterns formed in a similar manner to a surface of sandpaper.

In example embodiments, the at least one texture pattern may include a plurality of texture patterns, some of which are provided spaced apart from each other by a uniform distance.

In example embodiments, the at least one texture pattern may include a plurality of texture patterns, some of which are provided spaced apart from each other by at least two different distances.

In example embodiments, the at least one texture pattern may include a plurality of texture patterns, some of which are provided to have substantially the same depth as each other.

In example embodiments, the at least one texture pattern may include a plurality of texture patterns, some of which are provided to have at least two different depths.

In example embodiments, the at least one texture pattern may be provided in an engraved shape.

In example embodiments, the at least one texture pattern may be provided in an embossed shape.

In example embodiments, the vessel may include a plurality of collection bottles having entrances positioned at different levels in a vertical direction, and the at least one texture pattern may be provided on an inner side surface of each of the collection bottles.

In example embodiments, the at least one texture pattern may include a plurality of texture patterns provided along a circumference direction of the vessel, on the inner side surface of the vessel.

In example embodiments, the at least one texture pattern may include a vertical texture pattern provided perpendicular to a horizontal surface and parallel to a vertical direction.

In example embodiments, the at least one texture pattern may include an inclined texture pattern provided to be inclined with respect to a horizontal surface.

According to example embodiments of the inventive concept, a substrate-treating apparatus may include a vessel configured to provide a treatment space therein, a substrate-supporting unit provided in the vessel to support a substrate, and a spraying member configured to spray treatment solution on the substrate loaded on the substrate-supporting unit. The vessel may include a splitting member configured to split the treatment solution, when the treatment solution used for a substrate-treatment process collides with an inner side surface of the vessel.

In example embodiments, the splitting member may include a plurality of texture patterns provided on the inner side surface of the vessel along a circumference direction of the vessel.

In example embodiments, the texture patterns may be provided perpendicular to a horizontal surface and parallel to a vertical direction.

According to example embodiments of the inventive concept, a substrate-treating apparatus may include a vessel configured to provide a treatment space therein, a substrate-supporting unit provided in the vessel to support a substrate, and a spraying member configured to spray treatment solution on the substrate loaded on the substrate-supporting unit. The vessel may include a rebounding-prevention member configured to restrain the treatment solution from being rebounded toward the substrate, when the treatment solution used for a substrate-treatment process collides with an inner side surface of the vessel.

In example embodiments, the rebounding-prevention member may include a plurality of texture patterns provided on the inner side surface of the vessel along a circumference direction of the vessel.

In example embodiments, the texture patterns may be provided perpendicular to a horizontal surface and parallel to a vertical direction.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
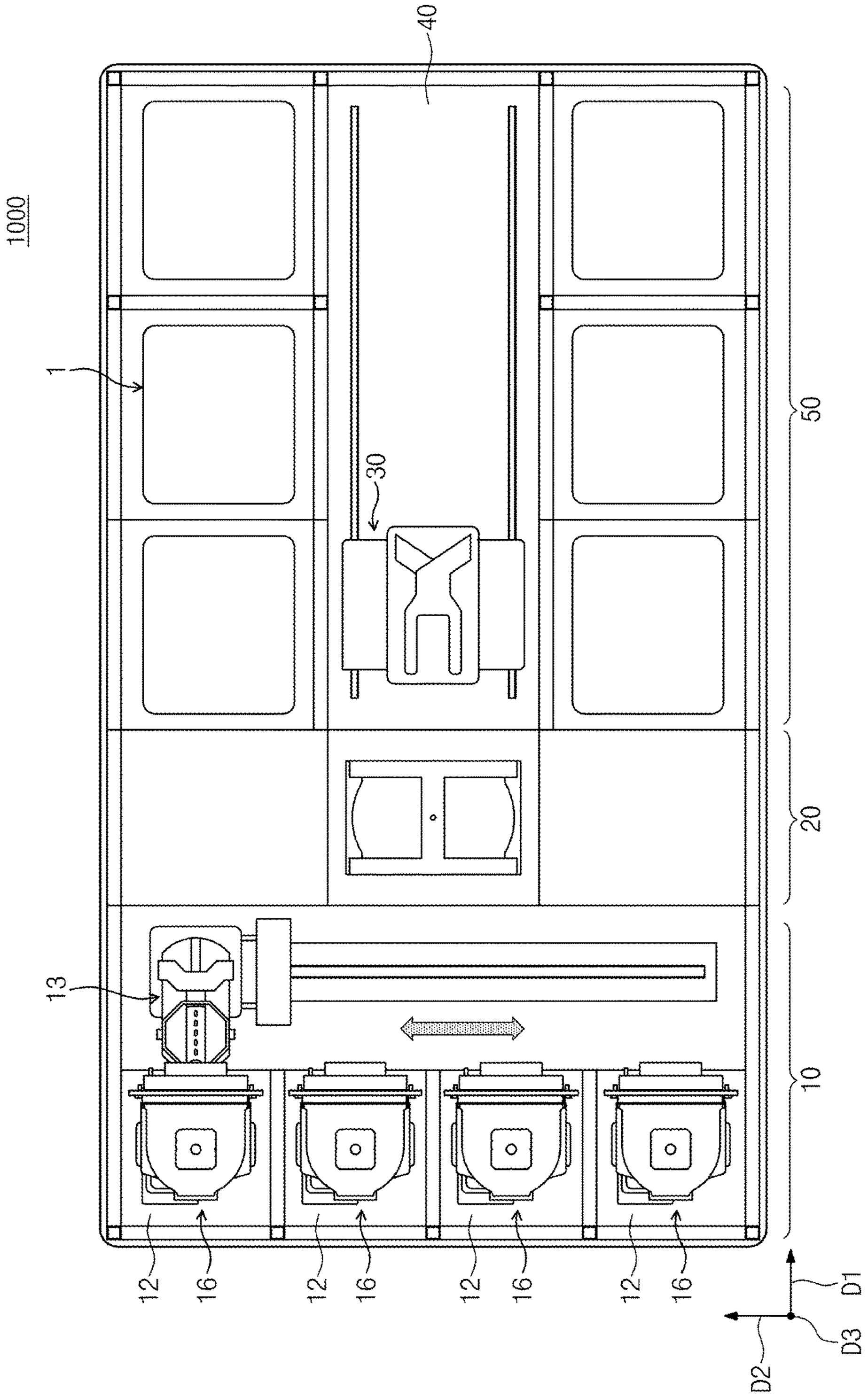
FIG. 1 is a plan view schematically illustrating a substrate treating system according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a plan view schematically illustrating a substrate treating system according to example embodiments of the inventive concept.

Referring to FIG. 1, a substrate treating system 1000, according to example embodiments of the inventive concept, may include an index module 10, a buffer module 20, and a treatment module 50.

The index module 10, the buffer module 20, and the treatment module 50 may be disposed in a sequential manner. Hereinafter, if the index module 10, the buffer module 20, and the treatment module 50 are arranged along a first direction D1, when viewed in a top view, a direction perpendicular to the first direction D1 will be referred to as a second direction D2, and a direction normal to a plane including the first and second directions D1 and D2 will be referred to as a third direction D3.

The index module 10 may include a load port 12 and an index robot 13.

The load port 12 may be disposed in front of the index module 10, in the first direction D1. The load port 12 may be provided in plural, and a plurality of load ports 12 may be disposed along the second direction D2. As an example, four load ports 12 may be provided in the index module 10. The number of the load ports 12 may be changed depending on process efficiency and/or footprint condition of the substrate treating system 1000. A carrier 16 may be loaded on the load ports 12, and the carrier 16 may be configured to contain a substrate w, which will be used in a substrate-treatment process or to which the substrate-treatment process has been performed. In example embodiments, a front opening unified pod (FOUP) may be loaded on the carrier 16. The carrier 16 may be configured to have a plurality of slots for storing the substrates w in a direction parallel to the earth's ground.

The index robot 13 may be installed between the load port 12 and the buffer module 20. The index robot 13 may be configured to move the substrate w from the carrier 16 to the buffer module 20 or vice versa. The substrate w to be moved into the carrier 16 may stay at an upper portion of the buffer module 20. The substrate w to be moved from the carrier 16 to the buffer module 20 may be positioned at a lower portion of the buffer module 20.

The buffer module 20 may be used to temporarily store the substrate w, to which the substrate-treatment process will be or has been performed (i.e., before transferring using the index robot 13 or a main transferring robot 30).

The treatment module 50 may include the main transferring robot 30, a transferring passage 40, and a substrate-treating apparatus 1. The substrate w transferred from the buffer module 20 may be treated in the substrate-treating apparatus 1 of the treatment module 50.

The main transferring robot 30 may be installed in the transferring passage 40. The main transferring robot 30 may be configured to allow the substrate w to be transferred between the respective substrate-treating apparatuses 1 and the buffer module 20. The main transferring robot 30 may transfer the substrate w staying in the buffer module 20 to a corresponding one of the substrate-treating apparatuses 1. The main transferring robot 30 may also transfer the substrate w in the substrate-treating apparatus 1, to which the substrate-treatment process has been performed, to the buffer module 20.

The transferring passage 40 may be disposed in the treatment module 50 and parallel to the first direction D1. The transferring passage 40 may be configured to allow the main transferring robot 30 to be moved. The substrate-treating apparatuses 1 may be arranged at both sides of the transferring passage 40 and along the first direction D1 to face each other in the second direction D2. At least one moving rail may be provided in the transferring passage 40, and the at least one moving rail may be provided to allow the main transferring robot 30 to be moved along the first direction D1 and to be moved not only to top and bottom levels of the substrate-treating apparatus 1 but also to top and bottom levels of the buffer module 20.

A plurality of the substrate-treating apparatuses 1 may be disposed at both sides of the transferring passage 40, in which the main transferring robot 30 is installed. In the substrate treating system 1000, the plurality of substrate-treating apparatuses 1 may be disposed to have a multi-layered arrangement. The number of the substrate-treating apparatuses 1 may be changed depending on the process efficiency and footprint condition of the substrate treating system 1000. Each of the substrate-treating apparatuses 1 may be configured to serve as an isolated chamber, allowing a substrate-treatment process to be independently performed. In other words, each of the substrate-treating apparatus 1 may be configured in such a way to perform a process on the substrate w in an isolated manner, independent of the others of the substrate-treating apparatuses 1.

Figure 2:
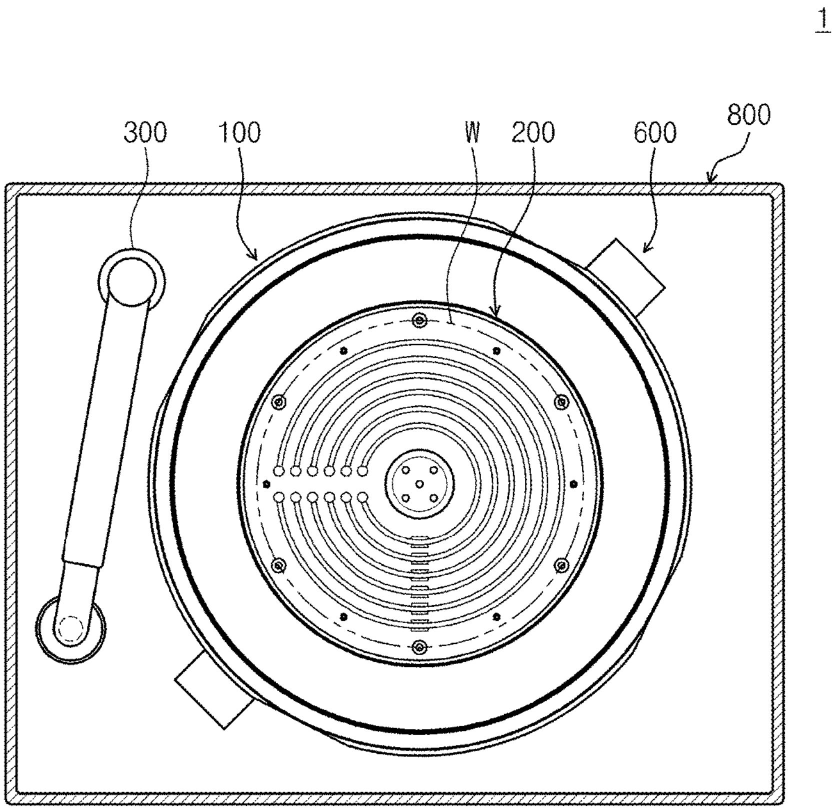
FIG. 2 is a plan view illustrating a substrate-treating apparatus of FIG. 1.
Figure 3:
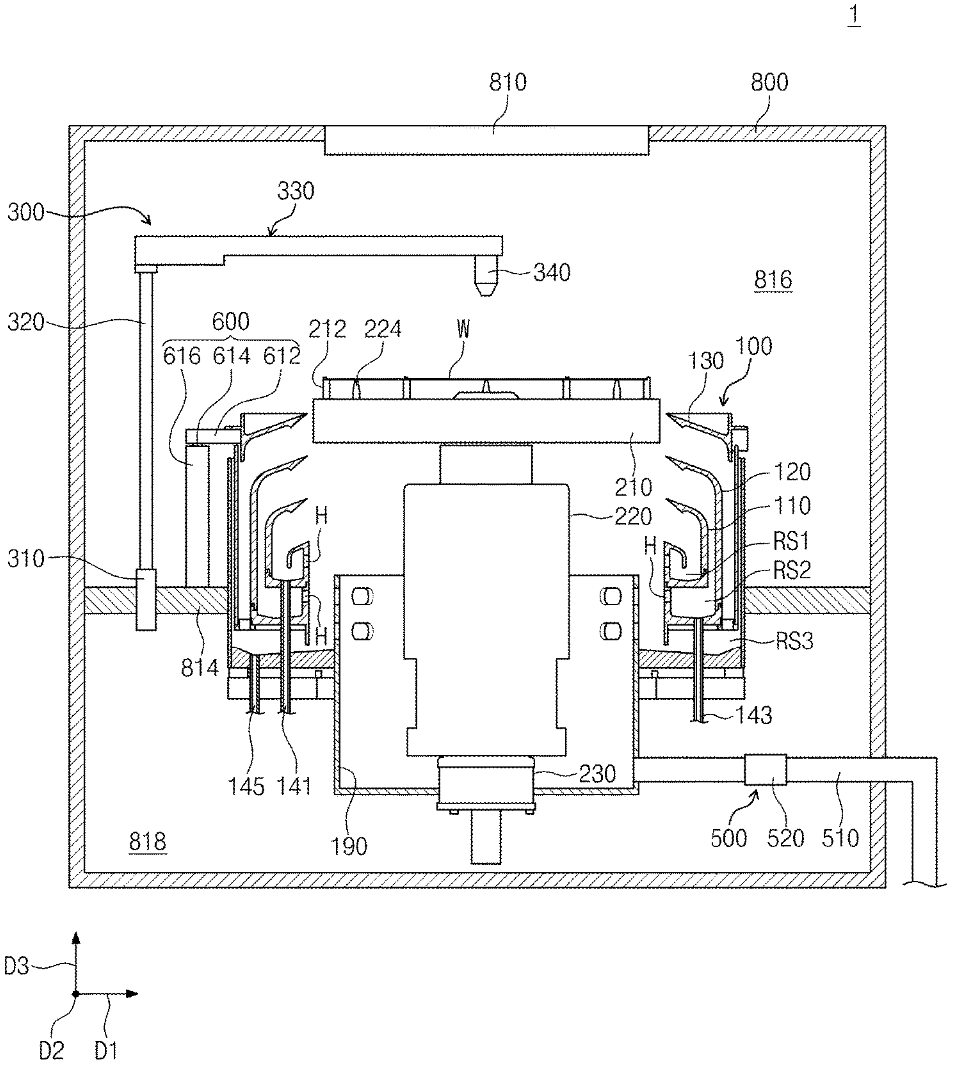
FIG. 3 is a sectional view illustrating a substrate-treating apparatus of FIG. 1.

FIG. 2 is a plan view illustrating a substrate-treating apparatus of FIG. 1. FIG. 3 is a sectional view illustrating a substrate-treating apparatus of FIG. 1. Referring to FIGS. 2 and 3, the substrate-treating apparatus 1 according to example embodiments of the inventive concept may include a chamber 800, a vessel 100, a substrate-supporting unit 200, a spraying member 300, an exhausting unit 500, and a lifting unit 600.

The chamber 800 may be configured to provide a hermetically sealed internal space. A fan filter unit 810 may be installed at a top portion of the chamber 800. The fan filter unit 810 may produce a descending air current in the chamber 800.

The fan filter unit 810 may include a filter and an air-supplying fan. The filter and the air-supplying fan may be provided in the form of a single unit or module. The fan filter unit 810 may supply a filtered outer air into the chamber 800. The outer air may pass through the fan filter unit 810 and may form the descending air current supplied into the chamber 800.

The chamber 800 may be divided into a process region 816 and a maintenance region 818 by a horizontal partition wall 814. The vessel 100 and the substrate-supporting unit 200 may be positioned in the process region 816. Exhausting lines 141, 143, and 145 connected to the vessel 100, an exhausting line 510, a driving part of the lifting unit 600, a driving part connected to the spraying member 300, supplying lines, and so forth may be disposed in the maintenance region 818. The maintenance region 818 may be isolated from the process region 816.

The vessel 100 may be provided in the form of a top-open cylinder. The vessel 100 may provide a treatment space for treating the substrate w. The open top entrance of the vessel 100 may serve as a passage for loading and unloading the substrate w. The substrate-supporting unit 200 may be provided in the treatment space. The substrate-supporting unit 200 may be configured to fasten the substrate w on a top surface thereof and moreover rotate the fastened substrate w, during a substrate-treatment process.

The vessel 100 may provide a lower space for a forced exhausting and a lower portion of the lower space may be connected to an exhausting duct 190. First to third collection bottles 110, 120, and 130 may be disposed in the vessel 100 to absorb and collect liquid chemical and gas blown off from the rotating substrate w.

The first to third collection bottles 110, 120, and 130 may have exhausting holes H, which are connected in common to a single circular space.

In detail, each of the first to third collection bottles 110, 120, and 130 may include a circular ring-shaped bottom portion and a circular sidewall vertically extending from the bottom portion. The second collection bottle 120 may be spaced apart from the first collection bottle 110 to enclose the first collection bottle 110. The third collection bottle 130 may be spaced apart from the second collection bottle 120 to enclose the second collection bottle 120.

The first to third collection bottles 110, 120, and 130 may provide first to third collection spaces RS1, RS2, and RS3, in which an air current containing treatment solution and fume blown off from the substrate w is absorbed and collected. The first collection space RS1 may be provided by the first collection bottle 110. The second collection space RS2 may be provided between the first collection bottle 110 and the second collection bottle 120. The third collection space RS3 may be provided between the second collection bottle 120 and the third collection bottle 130.

Each of the first to third collection bottles 110, 120, and 130 may be provided to have an open top entrance positioned at a central portion thereof. Each of the first to third collection bottles 110, 120, and 130 may be provided in such a way that a distance from the bottom portion thereof increases in a direction from a sidewall thereof to the top entrance thereof, thereby having an inclined surface. The treatment solution blown off from the substrate w may be flowed into the collection spaces RS1, RS2, and RS3 along top surfaces of the first to third collection bottles 110, 120, and 130.

First treatment solution flowed into the first collection space RS1 may be exhausted to the outside through the first exhausting line 141. Second treatment solution flowed into the second collection space RS2 may be exhausted to the outside through the second exhausting line 143. Third treatment solution flowed into the third collection space RS3 may be exhausted to the outside through the third exhausting line 145.

The substrate-supporting unit 200 may include a spin head 210, a supporting shaft 220, and a rotary driving part 230. The spin head 210 may include a supporting pin 224 and a chuck pin 212. When viewed in a top view, the spin head 210 may have a circular top surface.

The supporting pin 224 may be provided in plural. The supporting pin 224 may be disposed spaced apart from an edge of a top surface of the spin head 210 by a specific distance. The supporting pin 224 may support an edge of a bottom surface of the substrate w to separate the substrate w from the top surface of the spin head 210 by a specific distance. The supporting shaft 220 may be coupled to the spin head 210. The supporting shaft 220 may be configured to be rotated by the rotary driving part 230. The chuck pin 212 may be provided in plural. The chuck pin 212 may be provided outside the supporting pin 224. The chuck pin 212 may support a side portion of the substrate w to prevent the substrate w from being laterally deviated from its normal position, when the substrate-supporting unit 200 is rotated.

During the substrate-treatment process, the spraying member 300 may be configured to spray the treatment solution supplied onto a to-be-treated surface of the substrate w loaded on the spin head 210 of the substrate-supporting unit 200. The spraying member 300 may include a driving unit 310, a supporting shaft 320, a nozzle supporting part 330, and a spray nozzle 340.

The supporting shaft 320 may be provided in such a way that its longitudinal direction is parallel to the third direction D3, and a bottom portion of the supporting shaft 320 may be coupled to the driving unit 310. The driving unit 310 may be configured to rotate the supporting shaft 320. The nozzle supporting part 330 may be coupled to the supporting shaft 320 to move the spray nozzle 340 over the substrate w or to allow the spray nozzle 340 to spray treatment solution onto the substrate w.

The spray nozzle 340 may be positioned at a bottom surface of an end portion of the nozzle supporting part 330. The spray nozzle 340 may be moved by the driving unit 310 to a process position for the substrate-treatment process or to a standby position. The process position may be located over the vessel 100 in a vertical direction. The standby position may be located outside the vessel 100. The spray nozzle 340 may spray chemical solution, which is supplied from a chemical solution supplying apparatus, on the substrate w.

The exhausting unit 500 may be configured to exhaust materials supplied into the vessel 100 to the outside. In example embodiments, during the substrate-treatment process, the exhausting unit 500 may be configured to apply an exhausting pressure to at least one of the first to third collection bottles 110, 120, and 130, in which a process for collecting the treatment solution is being performed. The exhausting unit 500 may include the exhausting line 510 and a damper 520. The exhausting line 510 may be connected to the exhausting duct 190. The exhausting pressure applied by an exhausting pump may be exerted to the exhausting line 510, and the exhausting line 510 may be connected to a main exhausting line buried below a bottom floor of a semiconductor fabrication facility.

The vessel 100 may be coupled to the lifting unit 600 for changing a vertical position of the vessel 100. The lifting unit 600 may be configured to allow the vessel 100 to be linearly moved along a vertical direction. Such a vertical movement of the vessel 100 may make it possible to vary a vertical position of the vessel 100 with respect to the substrate-supporting unit 200.

The lifting unit 600 may include a bracket 612, a movement shaft 614, and a driving part 616. The bracket 612 may be installed on an outer sidewall of the vessel 100. The movement shaft 614 may be configured to be vertically moved by the driving part 616, and the movement shaft 614 may be coupled to the bracket 612. When the substrate w is loaded on or unloaded from the spin head 210, the vessel 100 may be moved downward in such a way that the spin head 210 protrudes over the vessel 100. During the substrate-treatment process, a height of the vessel 100 may be controlled, depending on a kind of the treatment solution supplied onto the substrate w, and this makes it possible for the treatment solution to be flowed into a predetermined one of the first to third collection bottles 110, 120, and 130. A relative vertical position between the vessel 100 and the substrate w may be changed. Accordingly, the vessel 100 may be configured to allow each of the collection spaces RS1, RS2, and RS3 to collect a corresponding kind of the treatment solution and contaminant gas.

In example embodiments, the substrate-treating apparatus 1 may be configured to vertically move the vessel 100 and change a relative vertical position of the vessel 100 with respect to the substrate-supporting unit 200. The substrate-treating apparatus 1 may also be configured to vertically move the substrate-supporting unit 200 and change a relative vertical position of the substrate-supporting unit 200 with respect to the vessel 100.

Figure 4:
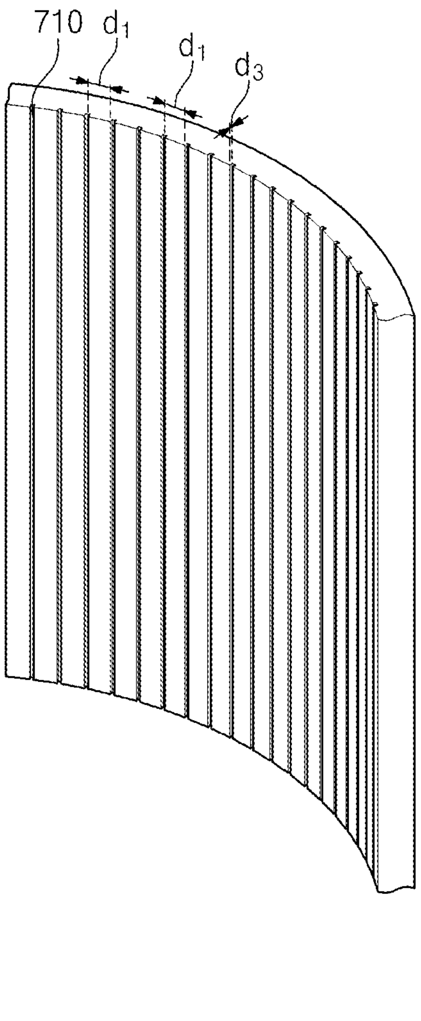
FIG. 4 is a diagram illustrating an example of a vessel with texture according to example embodiments of the inventive concept.

FIG. 4 is an example of an inner side surface of the vessel. Referring to FIG. 4, the vessel 100 may be provided to have an inner side surface with texture. The texture may be linear. The texture may be realized by vertical texture patterns 710, which may be formed in a vertical direction perpendicular to a horizontal surface. The vertical texture patterns 710 may be provided in plural. A plurality of the vertical texture patterns 710 may be provided in a circular manner along a circumference direction of the vessel 100. The vertical texture patterns 710 may be formed to be spaced apart from each other by a uniform distance d1. The vertical texture patterns 710 may be formed to have substantially the same depth d3. The vertical texture patterns 710 may be provided in the form of an intaglio.

The texture patterns formed on the inner side surface of the vessel 100 may guide the treatment solution collided with the vessel 100 toward a downward direction to prevent or restrain the treatment solution from being rebounded toward the substrate. Further, drops of the treatment solution collided with the vessel 100 may be split into smaller droplets by the texture patterns, and thus, it is possible to restrain a fraction of the treatment solution from being rebounded toward the substrate, when the split droplets collide with treatment solution flying toward the texture patterns.

Figure 5:
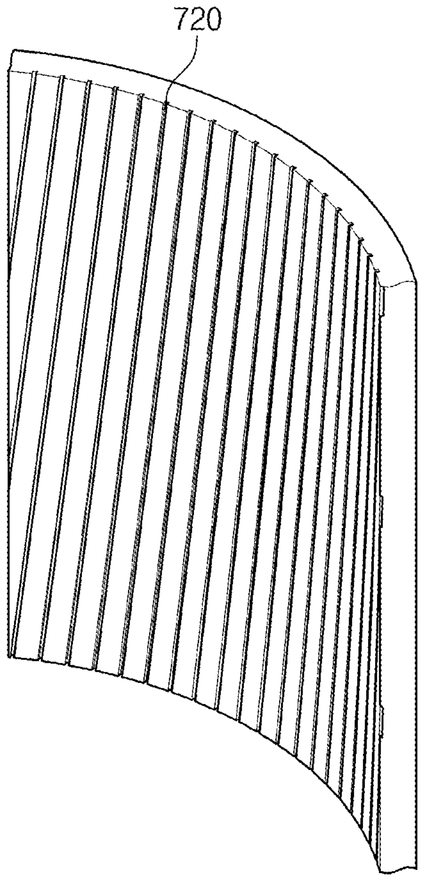
FIGS. 5 through 11 are diagram illustrating other examples of a vessel with texture according to other example embodiments of the inventive concept.
Figure 6:
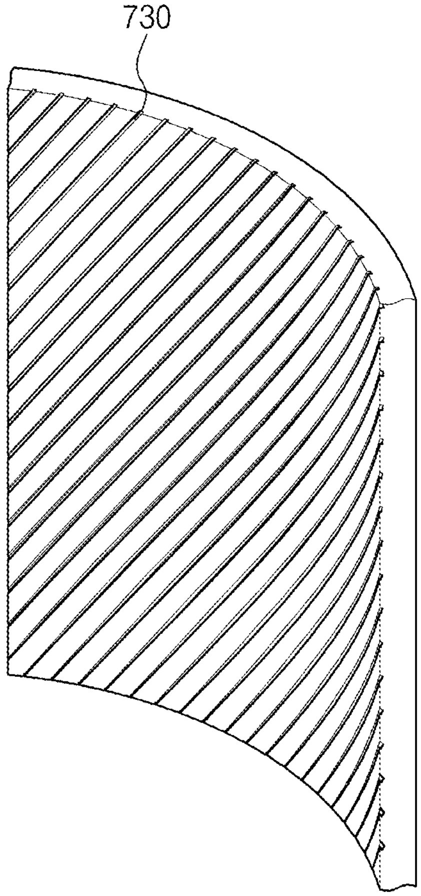
Figure 7:
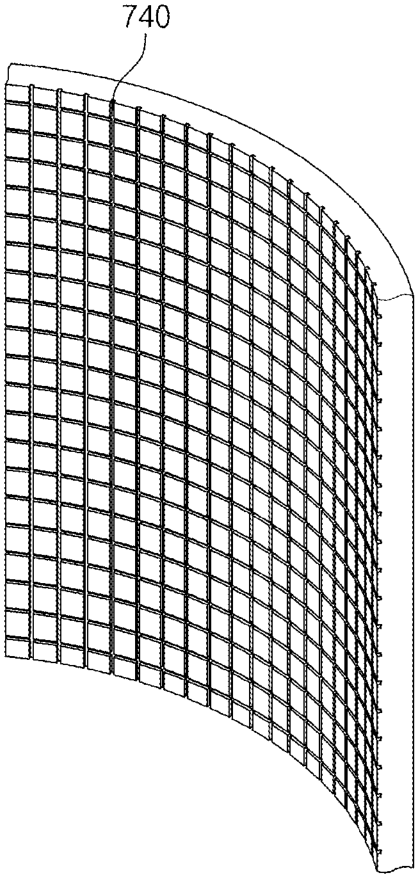
Figure 8:
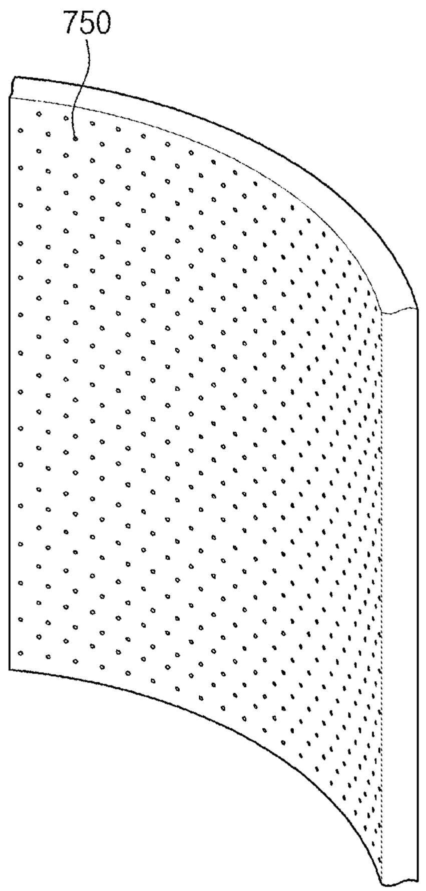
Figure 9:
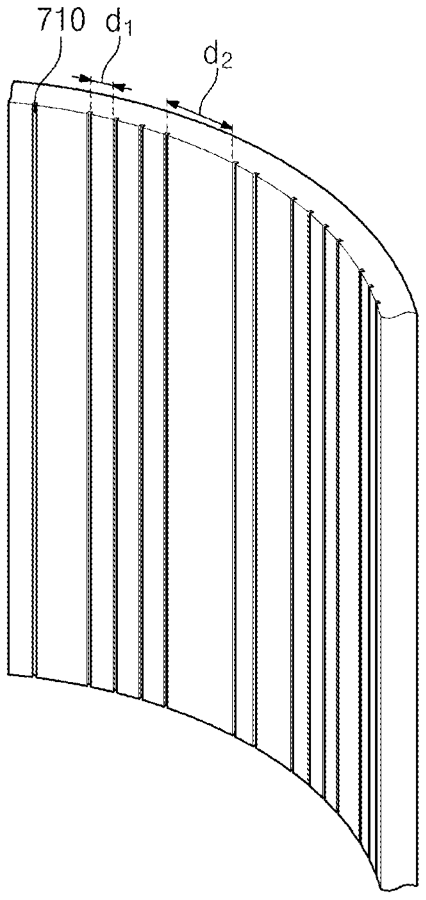
Figure 10:
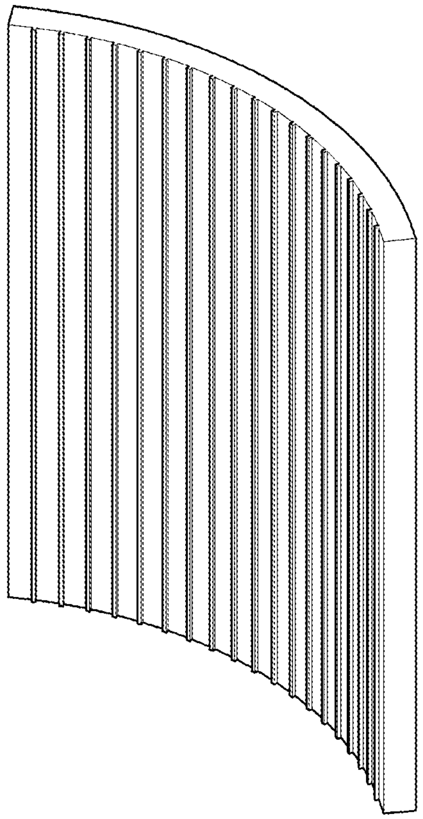
Figure 11:
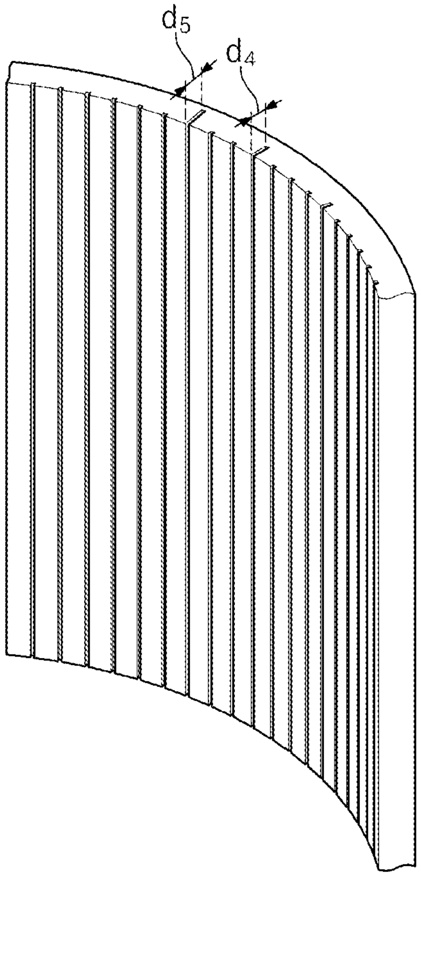

FIGS. 5 through 11 are diagram illustrating other examples of a vessel with texture according to other example embodiments of the inventive concept. As shown in FIG. 5, the vessel 100 may be provided to have inclined texture patterns 720, which are formed at an angle to the horizontal surface. As other example, the vessel 100 may be provided to have spiral texture patterns 730 formed in a spiral fashion, as show in FIG. 6. As still other example, the vessel 100 may be provided to have grid-shaped texture patterns 740 including vertical and horizontal texture patterns intersecting each other, as shown in FIG. 7. As even other example, the vessel 100 may be provided to have sanding texture patterns 750, which are formed in a similar manner to a surface of sandpaper, as shown in FIG. 8. As yet other example, the vessel 100 may be provided to have a plurality of vertical texture patterns 710 formed to have at least two different distances d1 and d2, as shown in FIG. 9. As further example, the vessel 100 may be provided to have embossed texture patterns, as shown in FIG. 10. Alternatively, as shown in FIG. 11, the vessel 100 may be provided to have a plurality of vertical texture patterns 710, some of which are formed to have at least two different depths d4 and d5.

Figure 12:
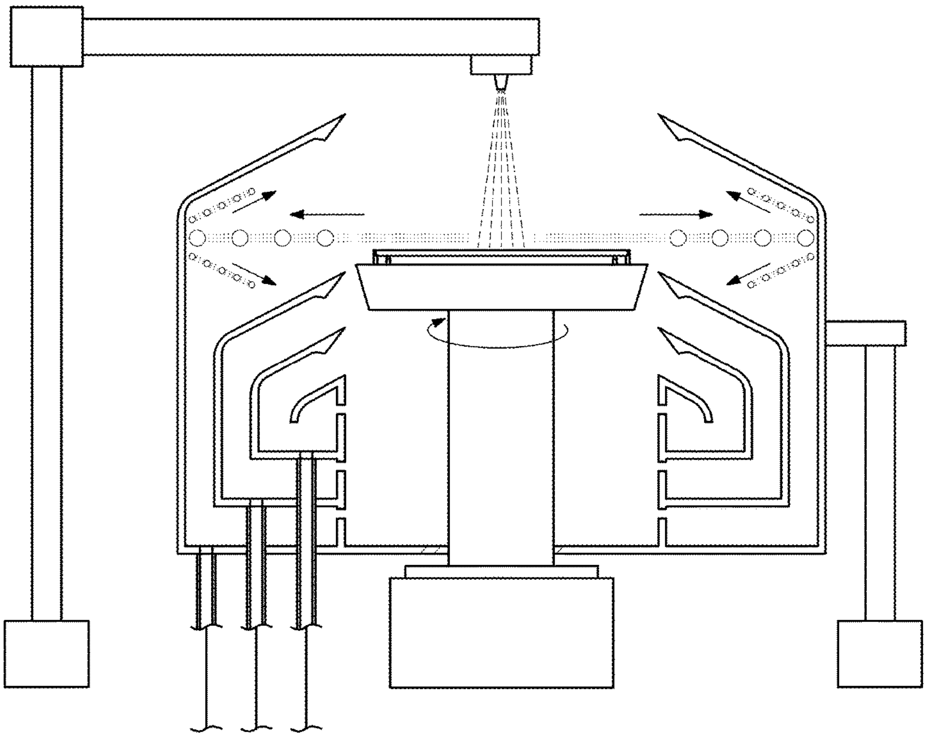
FIG. 12 is a diagram schematically illustrating a trajectory of treatment solution, when a vessel is provided to have a smooth inner side surface.
Figure 13:
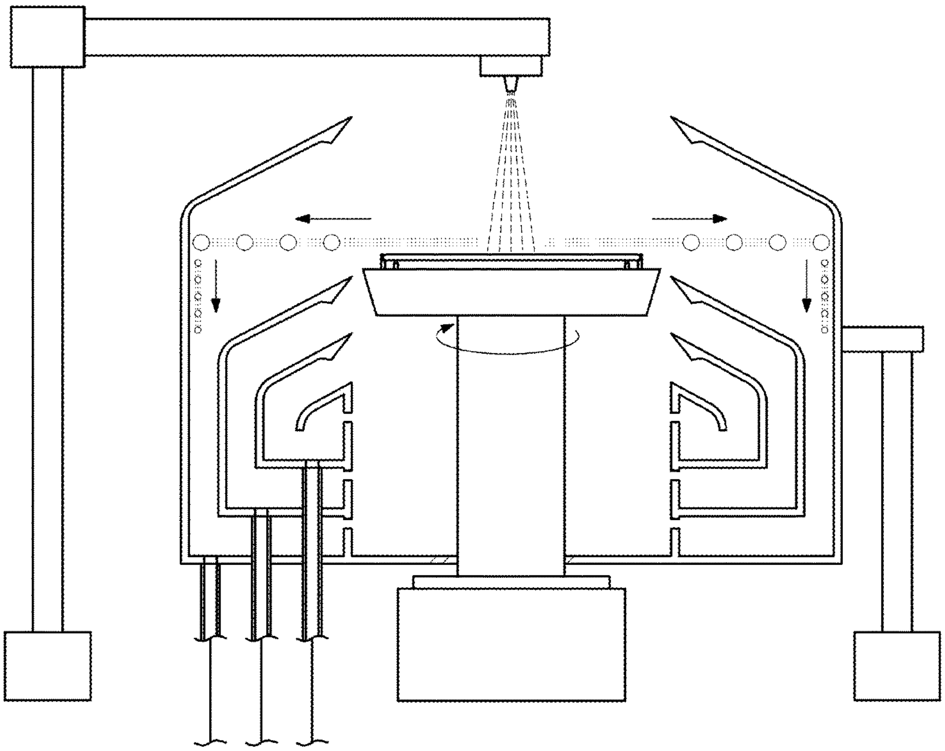
FIG. 13 is a diagram schematically illustrating a trajectory of treatment solution, when a vessel is provided to have the structure shown in FIG. 4.

FIG. 12 is a diagram schematically illustrating a trajectory of treatment solution, when a vessel is provided to have a smooth inner side surface, and FIG. 13 is a diagram schematically illustrating a trajectory of treatment solution, when a vessel is provided to have the structure shown in FIG. 4. Referring to FIGS. 12 and 13, in the case where the vessel is provided to have a smooth inner side surface, chemical solution used may be collided with the inner side surface of the vessel by a centrifugal force to form a large amount of large-sized drops to be rebounded toward the substrate. This may lead to contamination of the substrate.

However, as show in FIG. 13, in the case where the substrate-treatment process is performed using the vessel, whose inner side surface is formed to have the texture, chemical solution used for the substrate-treatment process may be split into a plurality of smaller droplets, as a result of a collision with the inner side surface of the vessel. Thereafter, the chemical solution may be streamed down along the texture of the inner side surface of the vessel.

In other example embodiments, the substrate-treating apparatus may include a vessel, a substrate-supporting unit, a spraying member, and a splitting member. The vessel may be configured to provide a treatment space therein. The substrate-supporting unit may be located in the vessel to support a substrate. The spraying member may be configured to spray treatment solution on a substrate loaded on the substrate-supporting unit. The splitting member may be configured to split the treatment solution into a plurality of fractions, drops, or streams, when the treatment solution used for the substrate-treatment process collides with the inner side surface of the vessel. The vessel, the substrate-supporting unit, and the spraying member may be configured to have substantially the same features as the vessel 100, the substrate-supporting unit 200, and the spraying member 300 of FIG. 2.

The splitting member may be provided on the inner side surface of the vessel. The splitting member may split the treatment solution colliding with the inner side surface of the vessel into a plurality of smaller drops. The splitting member may include a plurality of texture patterns provided along a circumference direction of the vessel. The plurality of texture patterns may be provided in the form of vertical texture patterns, inclined texture patterns, spiral texture patterns, grid-shaped texture patterns, or sandpaper-like texture patterns, as shown in FIGS. 4 through 8. Furthermore, the plurality of texture patterns may be provided in an engraved or embossed shape, as illustrated in FIG. 4 and FIG. 10. In addition, the plurality of texture patterns may be provided to have the same distance or at least two different distances, as illustrated in FIG. 4 and FIG. 9. The plurality of texture patterns may be provided to have the same depth or at least two different depths, as illustrated in FIG. 4 and FIG. 11.

In still other example embodiments, the substrate-treating apparatus may include a vessel, a substrate-supporting unit, a spraying member, and a rebounding-prevention member. The vessel may be configured to provide a treatment space therein. The substrate-supporting unit may be located in the vessel to support a substrate. The spraying member may be configured to spray treatment solution on a substrate loaded on the substrate-supporting unit. The rebounding-prevention member may be configured to restrain the treatment solution from being rebounded toward the substrate, when the treatment solution used for the substrate-treatment process collides with the inner side surface of the vessel. The vessel, the substrate-supporting unit, and the spraying member may be configured to have substantially the same features as the vessel 100, the substrate-supporting unit 200, and the spraying member 300 of FIG. 2.

The rebounding-prevention member may be provided on the inner side surface of the vessel. The rebounding-prevention member may be configured to restrain a fraction of the treatment solution from being rebounded toward the substrate, when the treatment solution used for the substrate-treatment process collides with the inner side surface of the vessel. The rebounding-prevention member may include a plurality of texture patterns provided along a circumference direction of the vessel. The plurality of texture patterns may be provided in the form of vertical texture patterns, inclined texture patterns, spiral texture patterns, grid-shaped texture patterns, or sandpaper-like texture patterns, as shown in FIGS. 4 through 8. Furthermore, the plurality of texture patterns may be provided in an engraved or embossed shape, as illustrated in FIG. 4 and FIG. 10. In addition, the plurality of texture patterns may be provided to have the same distance or at least two different distances, as illustrated in FIG. 4 and FIG. 9. The plurality of texture patterns may be provided to have the same depth or at least two different depths, as illustrated in FIG. 4 and FIG. 11.

According to example embodiments of the inventive concept, it is possible to restrain chemical solution from being rebounded toward a substrate, when the chemical solution collides with a vessel.

Furthermore, according to example embodiments of the inventive concept, in a substrate cleaning process, it is possible to restrain the chemical solution rebounded from the vessel from colliding with chemical solution moving toward the vessel.

In addition, according to example embodiments of the inventive concept, in a substrate cleaning process, it is possible to guide the chemical solution collided with the vessel to be flowed toward a lower portion of the vessel.

Also, according to example embodiments of the inventive concept, in a substrate cleaning process, it is possible to reduce a size of each drop of the chemical solution, which may be rebounded toward the substrate, as a result of collision with the vessel.

While example embodiments of the inventive concepts have been particularly shown and described, it will be understood by one of ordinary skill in the art that variations in form and detail may be made therein without departing from the spirit and scope of the attached claims.

What is claimed is:

1. A substrate-treating apparatus, comprising:

a vessel configured to provide a treatment space therein;

a substrate-supporting unit provided in the vessel to support a substrate; and a spraying member configured to spray treatment solution on the substrate loaded on the substrate-supporting unit, wherein the vessel has a cylindrical inner side surface, on which at least one linear texture pattern is formed, the vessel comprises a plurality of collection bottles having entrances positioned at different levels in a vertical direction, each of the plurality of collection bottles including a bottom portion, the at least one texture pattern is provided on an inner side surface of each of the collection bottles, and the at least one linear texture pattern comprises a plurality of linear texture patterns, some of which are provided spaced apart from each other in the cylindrical portion of the vessel by at least two different closest distances.

2. The substrate-treating apparatus of claim 1, wherein the at least one texture pattern comprises a vertical texture pattern provided perpendicular to a horizontal surface and parallel to the vertical direction.

3. The substrate-treating apparatus of claim 1, wherein the at least one texture pattern comprises a plurality of texture patterns, some of which are provided spaced apart from each other by a uniform distance.

4. The substrate-treating apparatus of claim 1, wherein the at least one texture pattern comprises a plurality of texture patterns, some of which are provided to have substantially the same depth as each other.

5. The substrate-treating apparatus of claim 1, wherein the at least one texture pattern comprises a plurality of texture patterns, some of which are provided to have at least two different depths.

6. The substrate-treating apparatus of claim 1, wherein the at least one texture pattern is provided in an engraved shape.

7. The substrate-treating apparatus of claim 1, wherein the at least one texture pattern is provided in an embossed shape.

8. The substrate-treating apparatus of claim 1, wherein the at least one texture pattern comprises a plurality of texture patterns provided along a circumference direction of the vessel, on the inner side surface of the vessel.

9. The substrate-treating apparatus of claim 8, wherein the at least one texture pattern comprises a vertical texture pattern provided perpendicular to a horizontal surface and parallel to the vertical direction.

10. A substrate-treating apparatus, comprising:

a vessel configured to provide a treatment space therein;

a substrate-supporting unit provided in the vessel to support a substrate; and a spraying member configured to spray treatment solution on the substrate loaded on the substrate-supporting unit, wherein the vessel comprises a splitting member configured to split the treatment solution, when the treatment solution used for a substrate-treatment process collides with an inner side surface of the vessel, and wherein the splitting member includes a linear shape, the linear shape including a continuous vertical linear shape provided perpendicular to a horizontal surface of the vessel and parallel to a vertical direction of the vessel, and at least four continuous horizontal linear shapes parallel to the horizontal surface and intersecting the continuous vertical linear shape.

11. A substrate-treating apparatus, comprising:

a vessel configured to provide a treatment space therein;

a substrate-supporting unit provided in the vessel to support a substrate; and a spraying member configured to spray treatment solution on the substrate loaded on the substrate-supporting unit, wherein the vessel comprises a rebounding-prevention member configured to restrain the treatment solution from being rebounded toward the substrate, in response to the treatment solution being used for a substrate-treatment process colliding with an inner side surface of the vessel, wherein the rebounding-prevention member includes a plurality of continuous linear texture patterns, some of which are spaced apart on a cylindrical portion of the vessel from adjacent ones by at least two different shortest distances.

* * * * *